(12) United States Patent
Arunachalam

(10) Patent No.: US 10,663,551 B2
(45) Date of Patent: May 26, 2020

(54) METHOD FOR CONSTRUCTING IMAGE FROM MRI DATA

(71) Applicant: VOXELGRIDS INNOVATIONS PRIVATE LIMITED, Karnataka (IN)

(72) Inventor: Arjun Arunachalam, Singapore (SG)

(73) Assignee: VOXELGRIDS INNOVATIONS PRIVATE LIMITED, Karnataka (IN)

( * ) Notice: Subject to any disclaimer, the term of this patent is extended or adjusted under 35 U.S.C. 154(b) by 305 days.

(21) Appl. No.: 15/549,402

(22) PCT Filed: Feb. 10, 2016

(86) PCT No.: PCT/SG2016/050064
§ 371 (c)(1),
(2) Date: Aug. 8, 2017

(87) PCT Pub. No.: WO2016/130084
PCT Pub. Date: Aug. 18, 2016

(65) Prior Publication Data
US 2018/0038932 A1 Feb. 8, 2018

(30) Foreign Application Priority Data
Feb. 10, 2015 (SG) .............................. 1020150108R

(51) Int. Cl.
*G01R 33/561* (2006.01)
*G01R 33/54* (2006.01)
(Continued)

(52) U.S. Cl.
CPC ...... *G01R 33/5611* (2013.01); *G01R 33/4835* (2013.01); *G01R 33/54* (2013.01); *G01R 33/56* (2013.01); *G01R 33/561* (2013.01)

(58) Field of Classification Search
CPC ............ G01R 33/4616; G01R 33/4824; G01R 33/4833; G01R 33/4835; G01R 33/4836;
(Continued)

(56) References Cited

U.S. PATENT DOCUMENTS 7,948,235 B2 * 5/2011 Foxall ................ G01R 33/4616
324/307
9,684,047 B2 6/2017 Arunachalam
(Continued)

FOREIGN PATENT DOCUMENTS

WO WO-2014/006633 A1 1/2014

OTHER PUBLICATIONS

Edelstein et al., "K-space Substitution: Spin-Warp MR Imaging and Applications to Human Whole-Body Imaging", Physics in Medicine and Biology, 1980, 25, pp. 751-756.
(Continued)

*Primary Examiner* — Steven L Yeninas
(74) *Attorney, Agent, or Firm* — Marshall, Gerstein & Borun LLP

(57) ABSTRACT

According to one aspect of the invention, there is provided a method of constructing an image of a sample from MRI data, the method comprising: i) selectively acquiring one or more sets of MRI data generated from driving signals created under a specific set of operation parameters; ii) deriving a matrix representative of the selective acquisition of the one or more sets of MRI data; iii) processing the selectively acquired MRI data with the matrix to obtain output data; and iv) synthesizing the output data to construct the image of the sample.

13 Claims, 9 Drawing Sheets

(51) Int. Cl.
G01R 33/56 (2006.01)
G01R 33/483 (2006.01)
(58) Field of Classification Search
CPC .... G01R 33/54; G01R 33/543; G01R 33/546; G01R 33/56; G01R 33/561; G01R 33/5608; G01R 33/5611–5618
USPC .................................................. 324/309, 314
See application file for complete search history.

(56) References Cited

U.S. PATENT DOCUMENTS

| | | | | |
|---|---|---|---|---|
| 2011/0044524 | A1* | 2/2011 | Wang | G01R 33/54 382/131 |
| 2011/0148410 | A1* | 6/2011 | Zaitsev | G01R 33/5611 324/309 |
| 2012/0256628 | A1* | 10/2012 | Wong | G01R 33/4836 324/309 |
| 2014/0091798 | A1 | 4/2014 | Arunachalam | |
| 2015/0234023 | A1* | 8/2015 | Grodzki | G01R 33/482 324/309 |

OTHER PUBLICATIONS

Van Vaals et al., ""Keyhole" Method for Accelerating Imaging of Contrast Agent Uptake", J Magn Reson Imaging, 1993, 3, pp. 671-675.
Korosec et al., "Time-resolved Contrast-enhanced 3D MR Angiography", Magn Reson Med, 1996, 36, pp. 345-351.
Tsao et al., "k-t Blast and k-t SENSE: Dynamic MRI With High Frame Rate Exploiting SpatioTemporal Correlations", Magn Reson Med, 2003, 50, pp. 1031-1042.
Madore et al., "Unaliasing by Fourier-encoding the Overlaps Using the Temporal Dimension (UNFOLD), Applied to Cardiac Imaging and fMRI", Magn Reson Med, 1999, 42, pp. 813-828.
Candes et al., "Robust Uncertainty Principles: Exact Signal Reconstruction From Highly Incomplete Frequency Information", IEEE Trans Inf Theory 2006, 52, pp. 489-509.
D. Donoho, "Compressed Sensing", IEEE Trans Inf Theory 2006, 52, pp. 1289-1306.
Lustig et al., "Sparse MRI: the Application of Compressed Sensing for Rapid MR Imaging", Magn Reson Med, 2007, 58, pp. 1182-1195.
Sodickson et al., "Simultaneous Acquisition of Spatial Harmonics (SMASH): Fast Imaging With Radiofrequency Coil Arrays", Magn Reson Med, 1997, 38, pp. 591-603.
Pruessmann et al., "SENSE: Sensitivity Encoding for Fast MRI", Magn Reson Med, 1999, 42, pp. 952-962.
Griswold et al., "Generalized Autocalibrating Partially Parallel Acquisitions (GRAPPA)", Magn Reson Med, 2002, 47, pp. 1202-1210.
Wiesinger et al., "Electrodynamics and Ultimate SNR in Parallel MR Imaging", Magn Reson Med, 2004, 52, pp. 376-390.

Hardy et al., "128-channel Body MRI With a Flexible High-density Receiver-coil Array", Magn Reson Med, 2008, 28, pp. 1219-1225.
Otazo et al., "Combination of Compressed Sensing and Parallel Imaging for Highly Accelerated First-pass Cardiac Perfusion MRI", Magn Reson Med, 2010, 64, pp. 767-776.
Liang et al., "Accelerating SENSE Using Compressed Sensing", Magn Reson Med, 2009, 62, pp. 1574-1584.
Sieberlich et al., "Improved Radial GRAPPA Calibration for Real-time Free-breathing Cardiac Imaging", Magn Reson Med, 2011, 65, pp. 492-505.
Samsonov et al., "Advances in Locally Constrained k-space-Based Parallel MRI", Magn Reson Med, 2006, 55, pp. 431-438.
Breuer et al., "Controlled Aliasing in Parallel Imaging Results in Higher Acceleration (CAIPIRINHA) for Multi-slice Imaging", Magn Reson Med, 2005, 53, pp. 684-691.
Sacolick et al., "Multi-Frequency Parallel Transmit for Multi-Slice Scan Acceleration", Proceedings of the International Society for Magnetic Resonance in Medicine 17th Annual Meeting Proceedings 2009, Apr. 18, 2009 (Apr. 18, 2009), p. 4507, Honolulu, Hawaii, USA.
Stenger et al., "Excitation UNFOLD (XUNFOLD) to Improve the Temporal Resolution of Multishot Tailored RF Pulses", Magnetic Reson Med, 2006, 56, pp. 692-697.
Stoer et al., Introduction to Numerical Analysis, Second Edition, Heidelberg: Springer; 1993, entire book.
Figueiredo et al., "On Total Variation Denoising: a New Majorization-minimization Algorithm and an Experimental Comparison With Wavelet Denoising", In Proceedings of the IEEE International Conference on Image Processing, Atlanta, Georgia, USA, 2006. pp. 2633-2636.
A. Arunachalam, "Enhancing the Performance of Accelerated MRI Through Preservation of Acquisition SNR: An "Aliased" k-space Approach", Magnetic Resonance in Medicine, vol. 74, No. 1, Aug. 1, 2014, pp. 150-161.
Pruessmann et al., "Advances in Sensitivity Encoding With Arbitrary k-Space Trajectories", Magnetic Resonance in Medicine, vol. 46, No. 4, Oct. 2, 2001, pp. 638-651.
Akçakaya et al., "Low-Dimensional-Structure Self-Learning and Thresholding: Regularization Beyond Compressed Sensing for MRI Reconstruction", Magnetic Resonance in Medicine, vol. 66, No. 3, Apr. 4, 2011, pp. 756-767.
G. Schultz, "Chapter 2: Image Reconstruction in MRI, Magnetic Resonance Imaging With Nonlinear Gradient Fields", Dec. 31, 2013 [Retrieved on Mar. 30, 2016] DOI: 10.1007/978-3-658-01134-5_2, 11 pages.
R. Nana, "On Optimality and Efficiency of Parallel Magnetic Resonance Imaging Reconstruction: Challenges and Solutions", Ph.D. Dissertation, Georgia Institute of Technology, Jan. 22, 2009, [Retrieved on Mar. 30, 2016] (DOI: 10.1.1.329.7988), whole document, esp. section 1.3.2, 176 pages.
Search Report and Written Opinion in International Application No. PCT/SG2016/050064 dated Apr. 7, 2016, 7 pages.
International Preliminary Report on Patentability in International Application No. PCT/SG2016/050064 dated Jan. 12, 2017, 21 pages.

* cited by examiner

METHOD FOR CONSTRUCTING IMAGE FROM MRI DATA

FIELD OF INVENTION

This invention relates to the field of Magnetic Resonance Imaging (MRI). In particular, the disclosed invention relates to techniques for optimizing data acquisition and restoration of acquired k-space data samples.

BACKGROUND

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be sampled and processed to form an image.

When utilizing these "MR (magnetic resonance)" signals to produce images, magnetic field gradients ($G_x$, $G_y$ and $G_z$) are employed. Typically, the region to be imaged is scanned by a sequence of measurement cycles, in which these gradients vary according to the particular localization method being used. The resulting set of received MR signals are digitized and processed to reconstruct the image.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle (referred to as TR in MRI literature), or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear" or a "Cartesian" scan. The spin-warp scan technique is discussed in [1]. The method, referred to as spin-warp imaging, employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

The fundamental limitation imposed by magnetic field gradients on MRI data acquisition rates is that only a sequential acquisition of k-space samples along a particular sampling trajectory is possible. To circumvent this limitation, several approaches have been proposed and all under-sample k-space data. For instance in dynamic MRI [2]-[5], assumptions are made regarding the imaged object and/or temporal signal of interest to exploit data redundancy through k-space under-sampling. In compressed sensing (CS) [6]-[8], under-sampled data are projected onto a transform domain where its representation is sparse thus capturing signal information in a few samples. Parallel imaging (PMRI) [9]-[11] uses multiple receivers simultaneously to acquire under-sampled k-space, which is then restored to its full state by using receiver sensitivity profiles.

FIG. 1 shows an illustration 100 of an under-sampling technique applied on the k-space of an MRI image (k-space 1) formed by an array of sequential lines of data. Data that lies along four randomly chosen lines L1 to L4 in k-space 1 is shown as 104, 106, 108 and 110, respectively. In the under-sampling technique, only a portion of data (e.g. 104 and 108 that lie along lines L1 and L3) is acquired as 104' and 108' during the sampling process 102 to obtain an under-sampled k-space 1. During reconstruction, the original image is restored using the under-sampled k-space 1.

By under-sampling k-space, the volume of data acquired is sought to be minimized to reduce data acquisition time and thus accelerate a scan. However, the acceleration achievable with a technique is a function of its intrinsic properties. In CS, the limit is dictated by signal compressibility in the transform domain. In PMRI, the acceleration remains between 4 and 6 for two-dimensional (2D) Cartesian scans [12] that use coil arrays with as many as 128 channels [13]. Therefore, these methods have been combined in [14], [15] and also used with non-Cartesian sampling trajectories [16], [17], to increase acceleration.

One limitation common to all k-space under-sampling techniques is that signal to noise ratio (SNR) loss is unavoidable. Despite the advances, the challenges in increasing acceleration by minimizing acquisition SNR loss are non-trivial. This remains an area of interest [18] because of applications such as the evaluation of cardiac function that can always benefit from greater acceleration but are unable to do so because of SNR loss that can cause an unacceptable degradation in image quality.

Recently, a new method [19] for simultaneously acquiring distinct k-space data samples was introduced. During acquisition, the method uses a combination of RF pulses and gradients to overlap distinct k-space samples. Therefore, the data from the resultant acquisition consists of overlapped k-space samples and is referred to as "aliased k-space". In this method [19], the "aliased k-space" acquisition technique is designed exclusively for dynamic MRI applications wherein the overlapped k-space samples are also "tagged" in time during the acquisition. This tagging process enables an unfolding of the overlapped k-space samples during reconstruction.

FIG. 2 shows an example 200 of an overlapping technique applied on an MRI data (k-space 1) formed by an array of sequential lines of data. Data that lie along four randomly chosen lines L1 to L4 in k-space 1 is shown as 204, 206, 208 and 210, respectively. In the overlapping technique illustrated in FIG. 2, one or more such lines of data are acquired in an aggregated manner. For example, all data along the lines L1 and L2 is simultaneously captured, while all data along the lines L3 and L4 is simultaneously captured. In this case of the four chosen lines L1 to L4, the data aggregation may result in the formation of two groups: one comprising data 204 and 206 that lies along adjacent lines of data L1 and L2, the other comprising data 204 and 206 that lies along adjacent lines of data L3 and L4. The resulting data (Overlapped k-space1) from the overlapping technique would then have a first line of data (204+206)' that comprises data lying across L1 and L2; and a second line of data (208+210)' that comprises data lying across L3 and L4. During reconstruction, the original image is obtained by unfolding this Overlapped k-space1.

Subsequently, an improvement on this technique was introduced [20] in which it was demonstrated that the unfolding of the overlapped k-space samples can also be achieved by using receiver sensitivity profiles. As a result, the technique introduced in reference [19] is no longer restricted to dynamic MRI technique and becomes applicable for all MRI scans.

A unique property of "aliased k-space" acquisitions is that depending on the manner in which the k-space samples are overlapped, it is possible to actually preserve, if not enhance, SNR (signal to noise ratio) during data acquisition while simultaneously accelerating the scan. A full description of the "aliased k-space" data acquisition, the restoration using receiver sensitivity profiles, and the related SNR properties has been described in detail in [20].

It is also relevant to note that while certain types of multi-slice PMRI acceleration techniques [21]-[22] can also be interpreted to be the overlap of k-space samples, this is an outcome of a process that overlaps different imaging slices onto each other. In these approaches, the overlapping of data samples only occurs along a spatial dimension (x, y or z). In contrast, in the "aliased k-space" acquisition approach described in [19]-[20], the overlapping samples originally lie along a phase-encoding axis within the k-space of a single slice or a single volume. Therefore, the acquisition approach in [19]-[20] brings about the ability to directly overlap k-space samples that lie along phase encoding axes in k-space, thus differentiating it from the approach described in [21]-[22]. Hence, it is now possible to perform "aliased k-space" acquisitions of a single slice or a single volume, as the case may be.

FIG. 3 shows an example of a combination of RF pulse 302 and gradient pulse 304, 306 and 308, designed for an "aliased k-space" acquisition that overlaps three blocks of k-space data. In FIG. 3, waveform 302 represents the three RF pulses, waveform 304 represents the phase encoding gradient blips ($G_{pe}$). "A" refers to amplitude of slice select gradient pulses ($G_{sl}$) 306. Waveform 308 represents readout gradient ($G_r$). In waveform 302, θ1, θ2 and θ3 refer to flip angles of the three RF pulses in 302. The resultant signal in an "aliased k-space" 2D acquisition using this combination of RF pulse 302 and gradient pulse 304, 306 and 308 is given by the following:

$$S(t) = \iint O(x,y)\{a_1 e^{-ik_1 y} + a_2 e^{-ik_2 y} + a_3 e^{-ik_3 y}\} e^{-ik_x x} dx dy \quad [1]$$

In Equation [1], $k=\gamma(G_{pe1}+G_{pe2}+G_{pe3})yt_p$, $k_2=\gamma(G_{pe2}+G_{pe3})yt_p$, $k_3=\gamma(G_{pe3})yt_p$, $t_p$ is the duration of the phase encoding (PE) gradient blips, O(x,y) is a 2D axial slice, y is gyromagnetic ratio, $a_1$, $a_2$, and $a_3$ are the amplitudes of the signal components that the RF pulses 302 in FIG. 3 generate. After discretization of spatial locations and receiver sensitivities, the acquisition process represented by Equation [1] can be re-written in matrix form as follows:

$$E_{(n,l),\rho} = \left[\sum_{m=1}^{R_k} a_m e^{ik_n^m r_\rho}\right] C_l(r_\rho) \quad [2]$$

In Equation [2], $r_\rho$ denotes the $p^{th}$ voxel location, $k_n^m$ is the $m^{th}$ sample at the $n^{th}$ location in aliased k-space, $C_l$ is the spatial sensitivity profile of the $l^{th}$ MRI receiver and $a_m$ are the amplitudes of the signal components that are aliased to obtain the "aliased k-space".

Accordingly, an "aliased k-space" acquisition is given by:

$$Ev=d \quad [3]$$

In Equation [3], E is the encoding matrix, v is the desired image vector and d is the acquired aliased k-space data from all receivers. This encoding matrix E can employ either the image domain or the k-space equivalent of the receiver sensitivity profiles. Additional details on these signal acquisitions and the subsequent data restoration stages have been provided in [20].

Of all the data overlapping patterns that are applicable in an "Aliased k-space" acquisition, FIG. 4 shows an overview of a process 400 using the "block aliasing" approach described in [20]. In FIG. 4, k-space data 404 of the original image 402 is divided into 3 equal blocks A 406, B 408 and C 410, which are weighted with the amplitudes $a_1$, $a_2$ and $a_3$ respectively and added to obtain the overlapped k-space data block 412. As discussed above, this "block aliasing" approach described in [20] possesses the property of preserving/enhancing SNR while simultaneously accelerating an MRI scan.

However, the primary challenge in restoring data that has been acquired through the "block aliasing" process 400 is that the encoding matrix E as defined above is poorly conditioned. This brings the following shortcomings:

1) Output image quality is extremely sensitive to errors in the estimates of the receiver spatial sensitivity profiles; and 2) The data restoration process needs a large number of receiver coils to be employed and the output image quality is dependent on receiver geometry.

In addition to these shortcomings, post reconstruction noise amplification is also high due to the poor condition of E. Therefore, an improvement on the condition of E for the block aliasing acquisition pattern is highly desirable in order to enhance the accuracy of and the quality of the output image from the data restoration process.

The present invention seeks to address the above shortcomings of "block aliasing" when restoring images acquired during MRI scans.

SUMMARY

According to one aspect of the invention, there is provided a method of constructing an image of a sample from MRI data, the method comprising: i) selectively acquiring one or more sets of MRI data generated from driving signals created under a specific set of operation parameters, wherein the driving signals comprise a RF pulse, to which the specific set of operation parameters controls any one or more of its flip angle and phase; and a gradient pulse, to which the specific set of operation parameters controls its gradient amplitude, and wherein the specific set of operation parameters are tuned based on a random variation of one or more of the flip angle of the RF pulse, the phase of the RF pulse and the gradient amplitude of the gradient pulse by keeping one or more of the flip angle of the RF pulse, the phase of the RF pulse and the gradient amplitude of the gradient pulse constant, and varying the remainder of the flip angle of the RF pulse, the phase of the RF pulse and the gradient amplitude of the gradient pulse; ii) deriving a matrix representative of the driving signals used to acquire the one or more sets of MRI data, wherein the matrix changes in response to the tuning of the specific set of operation parameters; iii) processing the selectively acquired MRI data with the matrix to obtain output data; and iv) synthesizing the output data to construct the image of the sample.

Also disclosed is a method of constructing an image of a sample from MRI data, the method comprising: i) selectively acquiring one or more sets of MRI data generated from driving signals created under a specific set of operation parameters; ii) deriving a matrix representative of the selective acquisition of the one or more sets of MRI data; iii) processing the selectively acquired MRI data with the matrix to obtain output data; and iv) synthesizing the output data to construct the image of the sample.

According to another aspect of the invention, there is provided an MRI data processing server for constructing an image of a sample from MRI data, the data processing server comprising: at least one processor; and at least one memory including computer program code; the at least one memory and the computer program code configured to, with the at least one processor, cause the server at least to: i) selectively acquire one or more sets of MRI data generated from driving signals created under a specific set of operation parameters, wherein the driving signals comprise a RF pulse, to which the specific set of operation parameters controls any one or more of its flip angle and phase; and a gradient pulse, to which the specific set of operation parameters controls its gradient amplitude, and wherein the specific set of operation parameters are tuned based on a random variation of one or more of the flip angle of the RF pulse, the phase of the RF pulse and the gradient amplitude of the gradient pulse by keeping one or more of the flip angle of the RF pulse, the phase of the RF pulse and the gradient amplitude of the gradient pulse constant, and varying the remainder of the flip angle of the RF pulse, the phase of the RF pulse and the gradient amplitude of the gradient pulse; ii) derive a matrix representative of the driving signals used to acquire the one or more sets of MRI data, wherein the matrix changes in response to the tuning of the specific set of operation parameters: iii) process the selectively acquired MRI data with the matrix to obtain output data; and iv) synthesize the output data to construct the image of the sample.

There is also disclosed an MRI data processing server for constructing an image of a sample from MRI data, the data processing server comprising: at least one processor; and at least one memory including computer program code; the at least one memory and the computer program code configured to, with the at least one processor, cause the server at least to: i) selectively acquire one or more sets of MRI data generated from driving signals created under a specific set of operation parameters; ii) derive a matrix representative of the selective acquisition of the one or more sets of MRI data; iii) process the selectively acquired MRI data with the matrix to obtain output data; and iv) synthesize the output data to construct the image of the sample.

BRIEF DESCRIPTION OF THE DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which.

DETAILED DESCRIPTION

Figure 1:
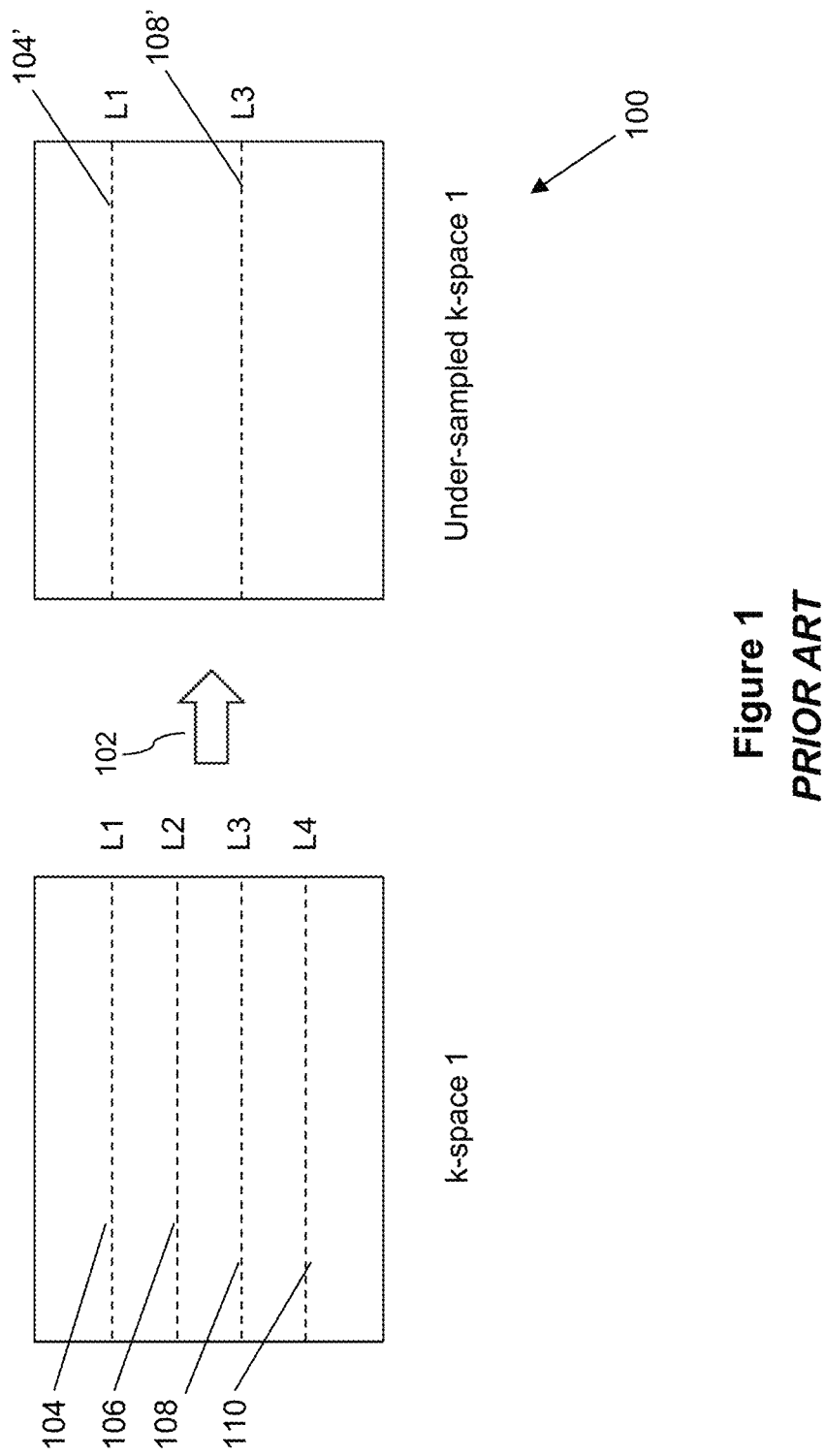
FIG. 1 shows an example of a conventional under-sampling technique.

In the following description, various embodiments are described with reference to the drawings, where like reference characters generally refer to the same parts throughout the different views.

Figure 5:
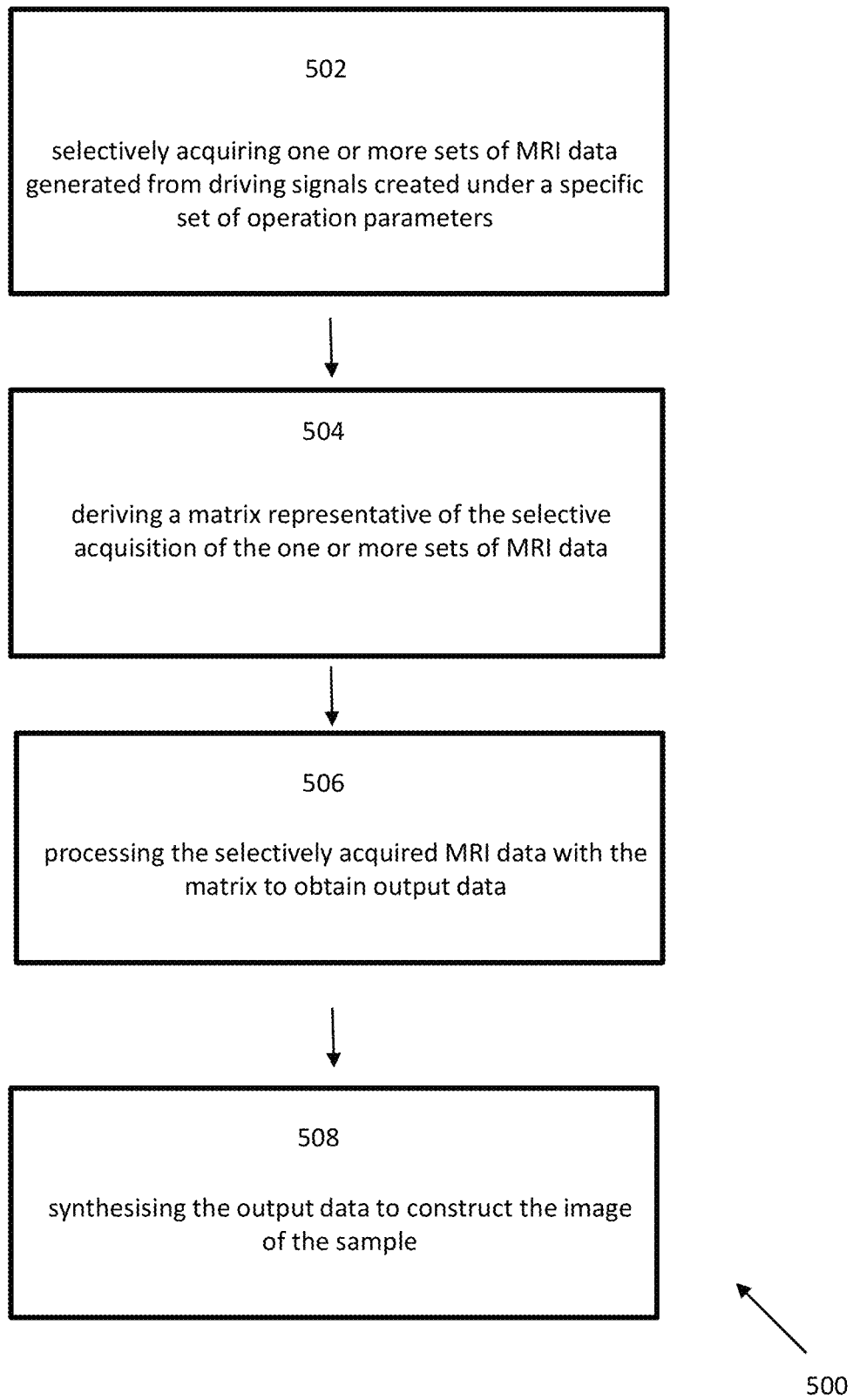
FIG. 5 shows steps of a method, in accordance with one implementation of the present invention, to acquire and construct a diagnostic image of a sample from MRI data acquired.

FIG. 5 shows steps of a method 500, in accordance with one implementation of the present invention, to construct an image from sample MRI data. The method 500 optimizes output, for example from restored overlapped k-space samples, by the conditioning of a matrix E used to construct the image.

The matrix E is derived from parameters of driving signals used to acquire MRI data from a sample. Since E is a matrix representation of the data acquisition process, modifications introduced in the "aliased k-space" data acquisition stage would be reflected in E through an alteration in the entries of E. In response to these modifications, the subsequent data restoration employs this modified matrix E that reflects the alterations made to the data acquisition stage. These alterations in turn improve the condition of this modified matrix E, which results in optimization of the output image quality.

Figure 3:
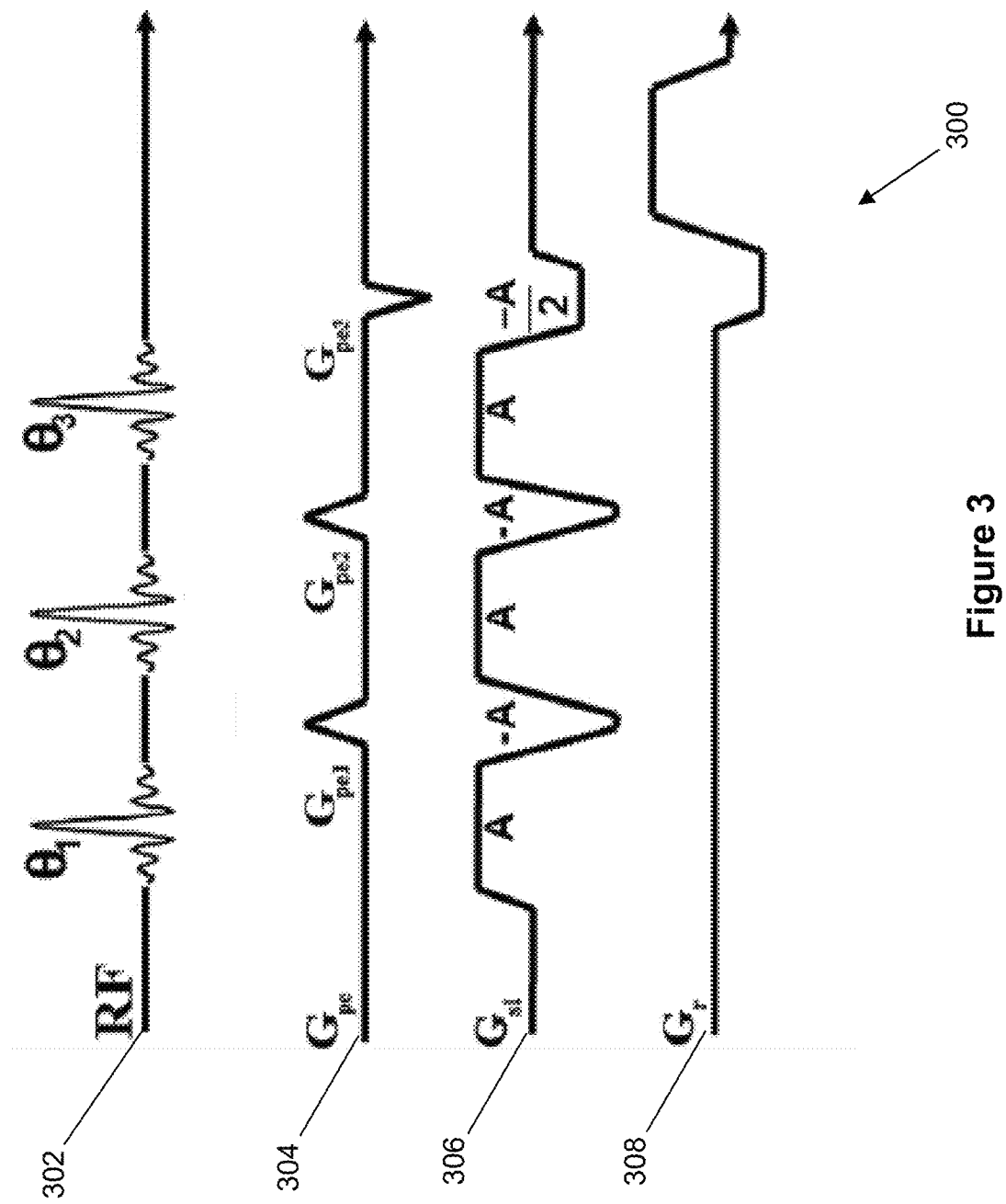
FIG. 3 shows an example of a combination of RF pulses and gradients used in an "Aliased k-space" acquisition and restoration technique.

In the present embodiment, RF pulses and gradient pulses can be used as driving signals that are used to excite a sample and obtain MRI data. A combination of RF pulses and gradients, such as those shown in FIG. 3, can be utilized, whereby the operation parameters used to produce these RF pulses and gradients can be controlled. The following provides examples of the operation parameters that can be controlled for the combination of RF pulses and gradients shown in FIG. 3:

1. Flip angles of the RF pulses 302, interchangeably referred to as RF pulse flip angles;

2. Phases of the RF pulses 302, interchangeably referred to as RF pulse phases;

3. Envelope design of the RF pulses 302, interchangeably referred to as RF pulse envelope; and 4. Amplitudes of the gradient pulses 304, interchangeably referred to as gradient amplitudes in effect area of these pulses 304.

In the present invention, the controlling comprises keeping one or more of the flip angle ($\theta 1$, $\theta 2$ and $\theta 3$) of the RF pulses 302, the phase of the RF pulses 302 and the gradient amplitude of the gradient pulses 304 constant, and varying the remainder of the flip angle (θ1, θ2 and θ3) of the RF pulses 302, the phase of the RF pulse 302 and the gradient amplitudes of the gradient pulses 304. The controlling may alternatively comprise varying all of the flip angle (θ1, θ2 and θ3) of the RF pulses 302, the phase of the RF pulses 302 and the gradient amplitudes of the gradient pulses 304. In both types of controlling, varying of the one or more of the flip angle (θ1, θ2 and θ3) of the RF pulses 302, the phase of the RF pulses 302 and the gradient amplitudes of the gradient pulses 304 is done either randomly or non-randomly.

Of these operation parameters, the RF pulse envelope is typically designed by taking into consideration the profile of the imaging plane/volume that has to be excited in a MRI scan.

As such, flip angles (θ1, θ2 and θ3), phases of the RF pulses 302 and gradient amplitudes of the gradient pulses 304 work as the design/operation parameters that may be varied for optimization of the matrix E that will reflect these variations.

In step 502 of the method 500, one or more sets of MRI data, which may be in "block aliased" k-space format, is selectively acquired. This k-space data is generated by driving signals, such as the RF pulses 302 and the gradient pulses 304, in a MRI system. The driving signals are created under a specific set of the operation parameters, and are tunable by altering the specific set of operation parameters. The specific set of operation parameters, as indicated above, comprise one or more of flip angles (θ1, θ2 and θ3) of the RF pulses 302, phases of the RF pulses 302, envelope design of the RF pulses 302 and amplitudes of the gradient pulses 304.

In an implementation of the present invention, the specific set of operation parameters can be altered by varying the flip angles (θ1, θ2 and θ3) and/or RF pulse phases and/or gradient amplitudes of the gradient pulses 304, in either a random fashion as defined by a suitable probability distribution function or in a non-random manner, from one measurement cycle to the next.

Figure 2:
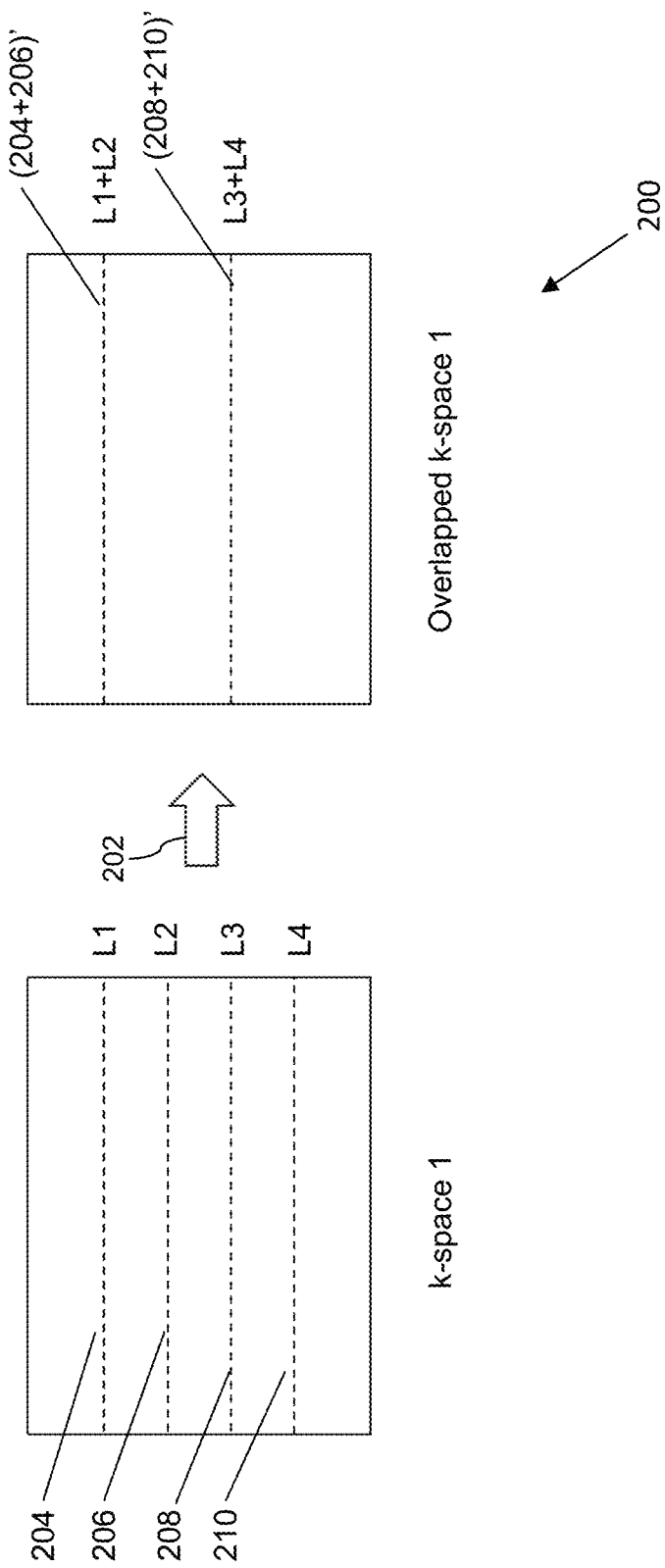
FIG. 2 shows an example of a conventional overlapping technique.
Figure 6:
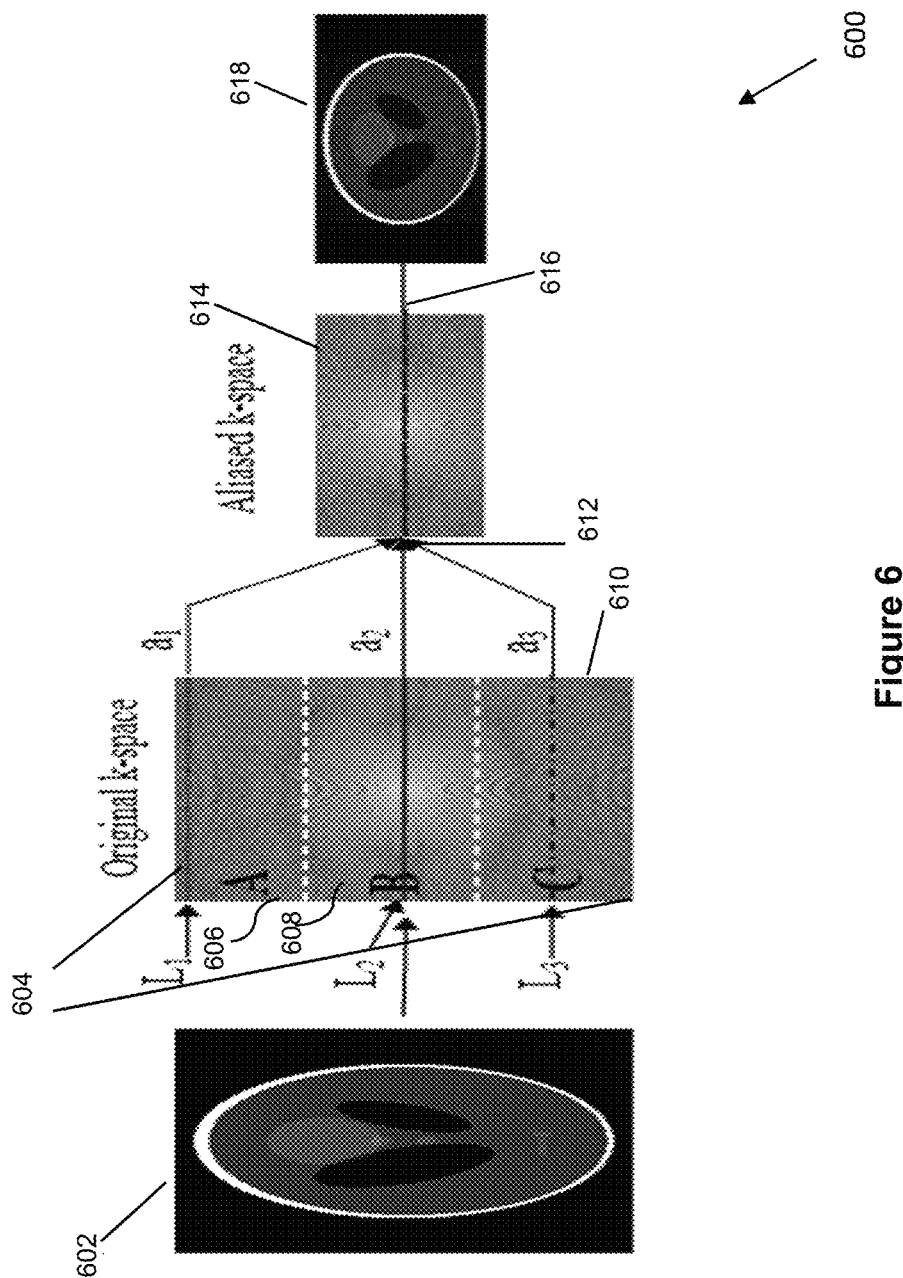
FIG. 6 shows an overview of a process in which the method shown in FIG. 5 is used.
Figure 7:
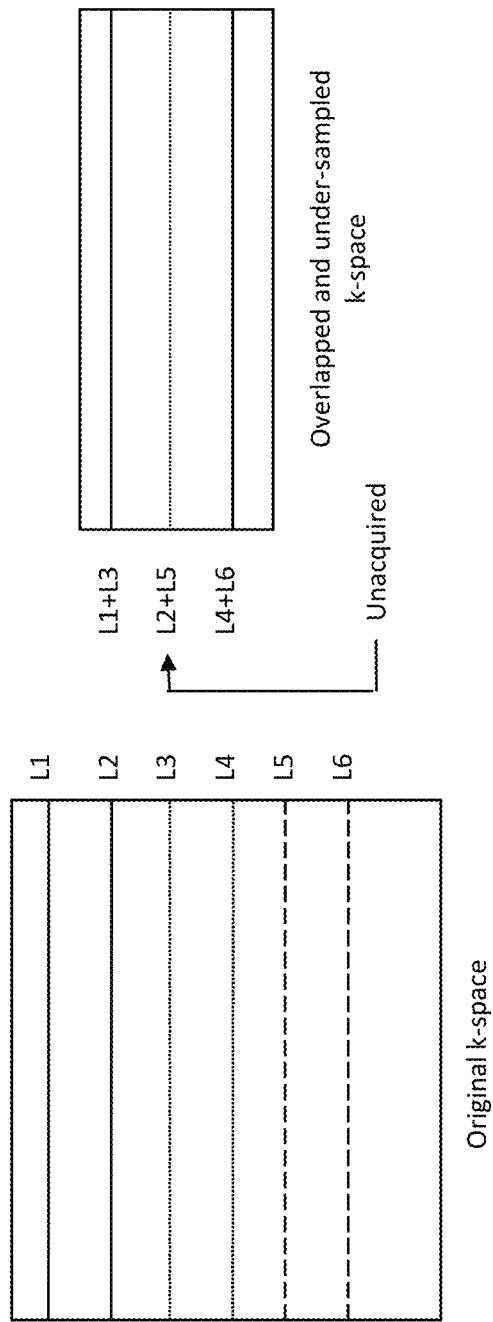
FIG. 7 illustrates an under-sampling technique applied on an overlapped MRI dataset (such as the overlapped k-space 1 of FIG. 2).

In an implementation of the present invention, the one or more sets of "block aliased" k-space data can be selectively acquired from a random selection employing an overlapping technique as illustrated in FIG. 2, or employing both an overlapping and under-sampling technique as shown in FIGS. 6 and 7. The selective acquisition of the one or more sets of k-space data is further described as follows.

In step 504, as the specific set of operation parameters of the driving signals used in the selective acquisition is known, a matrix E representing the selective acquisition of the one or more sets of MRI data is derived. In an embodiment of the present application, as the operation parameters of the driving signals can be tuned or altered in the process of MRI scanning, the derived matrix E also changes in response to the alteration of the specific set of operation parameters.

A plurality of MRI receivers may be employed during the process of k-space data acquisition. In an implementation of the present invention, the hardware parameters, particularly spatial sensitivity profiles, of the plurality of MRI receivers are also factored in when deriving the matrix E.

Steps 506 and 508 relate to data reconstruction of the "block aliased" k-space data. In step 506, the matrix E is used to process the acquired "block aliased" k-space data to obtain output data, i.e. output k-space data. This processing may involve having the acquired MRI data undergo a series of calculations and rules that are determined by the matrix E. Overlapped k-space data in the acquired "block aliased" k-space data are accordingly separated and restored in the output k-space data.

In step 508, the output k-space data is synthesized to construct the image of the sample. In one implementation, the synthesis involves performing a Fourier transformation on the restored output k-space data to obtain the output image.

In the present invention, each of the one or more sets of MRI data, i.e. "block aliased" k-space data may be generated under a different specific set of operation parameters, so that a different matrix E' is derived to process the respective MRI data.

FIG. 6 shows an overview of a process 600 in which the method 500 shown in FIG. 5 is used. In FIG. 6, the k-space data 604 of the original image 602 of the sample is divided into 3 equal blocks A 606, B 608 and C 610 and overlapped but lines of data within these blocks are overlapped randomly. For example, in FIG. 6 the locations of the data lines L1, L2 and L3 are randomly chosen and then overlapped 612 after being weighted with the respective amplitudes $a_1$, $a_2$ and $a_3$. Each of the driving signals comprises RF pulses 302, to which the specific set of operation parameters controls any one or more of its flip angle and phase; and gradient pulses 304, to which the specific set of operation parameters controls the gradient amplitudes.

The same process is repeated until all data from these blocks A 606, B 608 and C 610 have been overlapped. The image 618 from the aliased k-space 614 is the initial uncorrected image that is restored when the data samples within the aliased k-space are unfolded. As described in step 508, a Fourier transformation is performed on the unfolded data samples to obtain the final image.

This approach shown in FIGS. 6 and 7 is applicable for any "aliased k-space" acquisition that overlaps blocks of k-space data. It is irrelevant whether the overlapping blocks lie within a Cartesian sampling trajectory or a non-Cartesian one. Furthermore, there is no restriction on the number of samples that lie within these overlapping blocks. One can also have multiple such overlapping blocks during an accelerated scan.

The data reconstruction process for unfolding aliased k-space in step 506 is typically an iterative process that in an ideal embodiment employs the linear Conjugate gradient (CG) method [23]. This does not preclude the use of non-linear iterative reconstruction techniques or a direct inversion of E.

In one embodiment, the quadratic TV upper bound [24] is used as a regularization function in the linear CG method along with E and the acquired data to obtain the final output.

In this embodiment, the linear equation solved by the CG method that employs this TV upper bound is the following:

$$(E^hE+D^hWD)v=E^hd \qquad [4]$$

In Equation [4], D denotes a matrix that performs both vertical and horizontal first order differences along the image vector v. The matrix W is a diagonal matrix containing elements that are defined by the vertical and horizontal first order differences [24].

In an alternative embodiment, the regularization function is not employed by simply setting the matrix W to 0 in Equation [4].

Depending on the pulse sequence, either the flip angles of the RF pulses or the phases of the RF pulses or the amplitudes of the gradient pulses can be varied. In an ideal embodiment, only the amplitudes of the gradients should be varied while the flip angles and the phase should remain constant. When this option is not acceptable, alternative embodiments where the flip angles and/or phases are varied are employed. The approach is entirely determined by the pulse sequence that is chosen. For example, flip angles and phases cannot be varied with Gradient Echo [23] sequences and so gradient amplitudes should be varied. But varying flip angles and/or phases can be a more suitable option when blocks of data lying along non-Cartesian sampling trajectories are overlapped. Varying the gradient amplitudes in this case can become complicated due to the inherent difficulties in these trajectories and therefore need not be the preferred embodiment.

Figure 4:
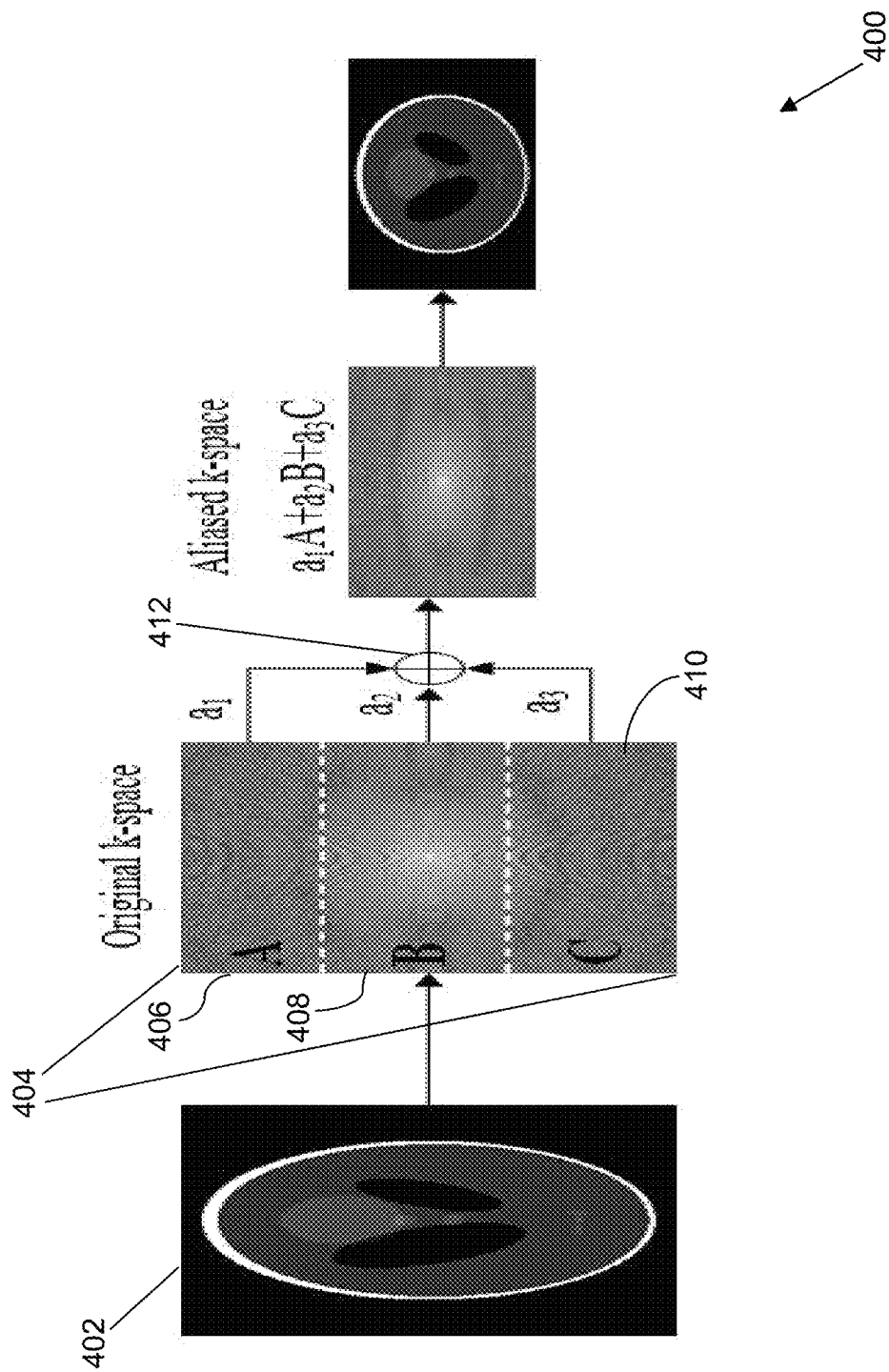
FIG. 4 shows an example of an overview of a "block aliasing" approach to acquire an aliased k-space dataset.

Referring to FIG. 4, a random variation in the gradient amplitudes will modify this "block aliasing" pattern to the one illustrated in FIG. 6. In FIG. 6, an example of three data lines L1, L2 and L3 have been shown, one each within the blocks 606 A, 608 B and 610 C. The locations of these overlapping data lines L1, L2 and L3 or phase encodes is random because the gradient amplitudes are being set randomly in this embodiment. Similarly, the other phase encodes, chosen from random locations from within each of the three blocks, are also overlapped. Therefore, while "block aliasing" is still performed, the location of the overlapping data lines from within these blocks is randomized by varying the gradient amplitudes. This randomization of data locations is also reflected in E, thus inherently improving its condition.

Similarly, in user defined non-random variations in the gradient amplitudes; the locations of these data lines will vary in accordance with the user defined amplitudes. The guideline used to design user defined variations in the case of gradient amplitudes is to ensure that the distance between the overlapping data sample locations in k-space remains small. This enhances the condition of E.

Random or non-random user-determined variations in the flip angles and/or phases do not alter the locations of the overlapping data lines in FIG. 4, but they impact the amplitudes, for example, $a_1$, $a_2$ and $a_3$, that these overlapping lines are weighted with. These amplitudes will now vary in either a random or non-random manner as the case may be, from one measurement cycle to the next.

Non-random variations in the case of flip angles and phases are designed by ensuring that their values are chosen in a manner that optimizes the trade-off amongst factors such as steady state magnetization, signal coherence and the condition of E. The impact of the flip angles and phases on these parameters has been described in all standard MRI texts. Randomization of these parameters is again reflected in E, thus improving its condition.

While FIGS. 4 and 6 are examples of "block aliasing" in a Cartesian sampling trajectory, the same principles hold for non-Cartesian sampling trajectories as well.

In addition to overlapping k-space samples, it is also possible and in many cases desirable to enhance the achievable scan acceleration by further under-sampling the "block aliased" k-space data in a manner identical to what is done in PMRI.

FIG. 7 shows an illustration of an overlapping and under-sampling technique applied on an MRI dataset (original k-space). In the overlapping and under-sampling technique, only a portion of data (e.g. a first line that contains data that lies along lines L1 and L3 and a second line that contains data that lies along lines L4 and L6 of the original k-space is acquired during the sampling process to obtain an Overlapped And Under-sampled k-space 1. Data that lies along lines L2 and L5 are not acquired. During reconstruction, the original image is restored using the overlapped and under-sampled k-space. While FIG. 7 shows that the dataset in Overlapped k-space 1 is the result of combining data lying along alternate lines (for example L1+L3; L4+L6) of the original image, the completion of an overlapped and under-sampled acquisition of k-space data as described above may randomly select data samples, as described above with respect to FIG. 6.

However, random variations in the flip angles and/or phases and/or gradient amplitudes preclude the use of conventional PMRI to synthesize these unacquired samples. Therefore, in embodiments where the relevant parameters are randomly varied and under-sampling is also employed during "block aliasing", the matrix E is further modified to reflect this process by simply not including the unacquired k-space locations in Equation [2]. Other than this change to the matrix E, the rest of the iterative data restoration process remains the same.

Therefore, the present invention is capable of delivering higher acceleration factors by combining "block aliasing" with data under-sampling. As long as the matrix E remains over-determined, the under-sampled, "block aliased" k-space dataset can be fully restored using the same iterative process. Therefore in this embodiment, the following additional changes will occur in the method as shown in FIGS. 5 and 6 of the present invention:

a. The completion of an overlapped acquisition of k-space data includes the additional step of under-sampling the "block aliased" data; and b. Step 506 includes an additional step of modifying the matrix E to also reflect the use of under-sampling during data acquisition by not including in E the un-acquired k-space locations.

If the variation in the flip angles and/or phases and/or gradient amplitudes is non-random, then the use of conventional PMRI to restore the unacquired samples in "block aliased" k-space data will become possible.

In the present invention, the iterative reconstruction process can include an intermediate stage where PMRI is first employed to synthesize the unacquired samples in "block aliased" k-space. Subsequent to the PMRI process, the rest of the iterative data restoration of step 506 will proceed without any modification to E.

Another embodiment where the use of PMRI with the disclosed invention is preferred is in the case of 3-dimensional k-space acquisitions where overlapping of samples is performed along one phase encoding (e.g $k_y$) axis while under-sampling is implemented along the $k_z$ phase encoding axis. In this case, the overlapping of samples can be random or non-random since PMRI is applied along only $k_z$ while unfolding of the overlapped samples is performed along the $k_y$ axis.

Therefore, in cases where additional scan acceleration is desired, an ideal embodiment of the invention will also include the use of under-sampling.

Figure 8:
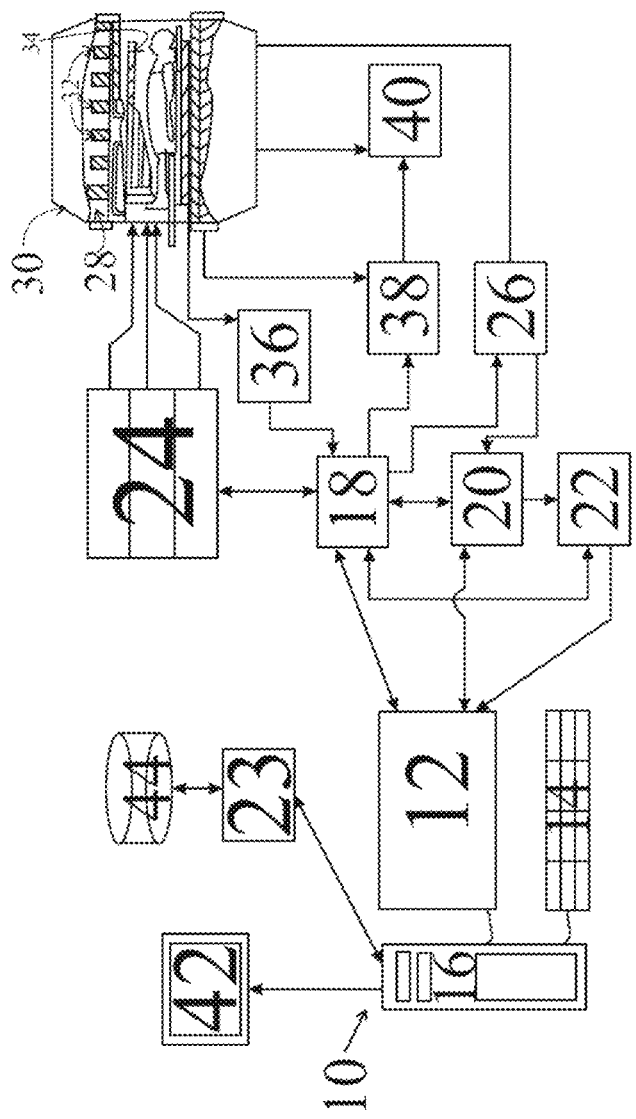
FIG. 8 shows a MRI system in which the method of FIGS. 5, 6 and 7 can be implemented.

The present invention can be practiced on an MRI system of the sort described in detail in FIG. 8. The system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34. The B1 excitation pulses are applied to the RF coil 34 by the RF system 26 to perform the prescribed magnetic resonance pulse sequence. Responsive MR signals detected by the RF coil 34 or a separate local coil (not shown in FIG. 6) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The RF excitation pulses may be applied to the whole body RF coil 34 or to one or more local receiver coils or receiver coil arrays (not shown in FIG. 8). The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2},\quad [5]$$

and the phase of the received MR signal may also be determined:

$$\varphi = \tan^{-1} Q/I.\quad [6]$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heartbeat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a back-projection image reconstruction of acquired MR data; the calculation of functional MR images, the calculation of motion or flow images, PMRI reconstruction of under-sampled k-space data and the like. Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

The data processing server 22 has at least one processor; and at least one memory including computer program code. The at least one memory and the computer program code are configured to, with the at least one processor, cause the data processing server 22 at least to: i) selectively acquire one or more sets of MRI data generated from driving signals created under a specific set of operation parameters; ii) derive a matrix representative of the selective acquisition of the one or more sets of MRI data; iii) process the selectively acquired MRI data with the matrix to obtain output data; and iv) synthesize the output data to construct the image of the sample. In an implementation, the derived matrix changes in response to alteration of the specific set of operation parameters.

As shown in FIG. 8, the RF system 26 may be connected to the whole body RF coil 34, or as shown in FIG. 8, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Figure 9:
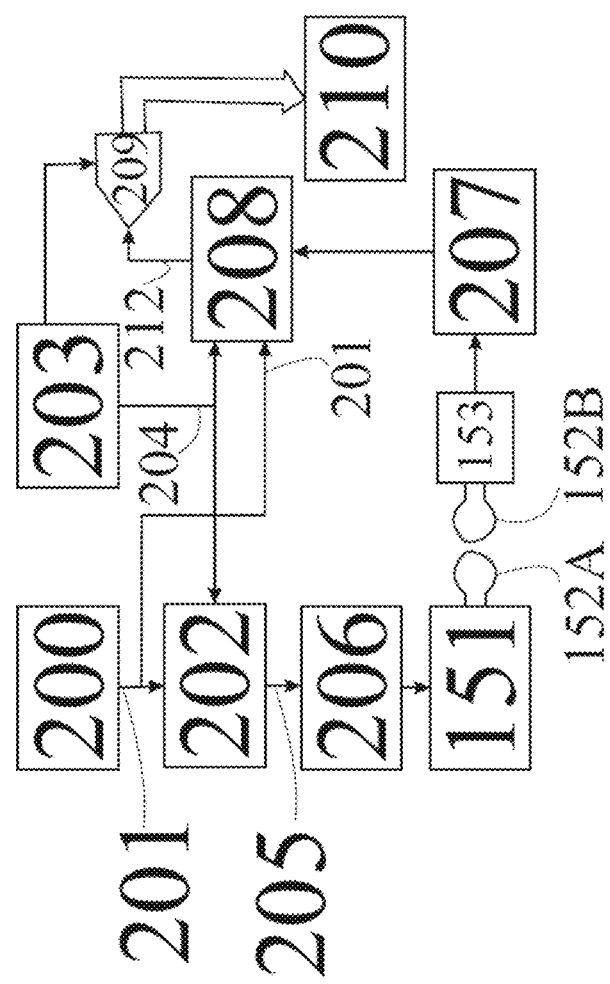
FIG. 9 shows components of a transmitter that produces a prescribed RF excitation field, the transmitter being part of the MRI system of FIG. 8.

Referring particularly to FIG. 9, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A. Referring still to FIG. 9, the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two-step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 is produced by a reference frequency generator 203.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

REFERENCES

[1] Edelstein W A, Hutchison J M S, Johnson G, Redpath T. K-space substitution: Spin-Warp MR Imaging and Applications to Human Whole-Body Imaging. Physics in Medicine and Biology 1980; 25:751-756.
[2] Van Vaals J J, Brummer M E, Dixon W T, Tuithof J J, Engels J, Nelson R C, Gerety B M, Chezmar J L, den Boer J A. "Keyhole" method for accelerating imaging of contrast agent uptake. J Magn Reson Imaging 1993; 3:671-675.
[3] Korosec F R, Frayne R, Grist T M, Mistretta C A. Time-resolved contrast-enhanced 3D MR angiography. Magn Reson Med 1996; 36:345-351.
[4] Tsao J, Boesiger P, Pruessmann K P. k-t Blast and k-t SENSE: dynamic MRI with High Frame Rate Exploiting SpatioTemporal Correlations. Magn Reson Med 2003; 50:1031-1042
[5] Madore B, Glover G H, Pelc N J. Unaliasing by Fourier-encoding the overlaps using the temporal dimension (UNFOLD), applied to cardiac imaging and fMRI. Magn Reson Med 1999; 42:813-828.
[6] Candes E J, Romberg J, Tao T. Robust uncertainty principles: exact signal reconstruction from highly incomplete frequency information. IEEE Trans Inf Theory 2006; 52:489-509.
[7] Donoho D L. Compressed sensing. IEEE Trans Inf Theory 2006; 52: 1289-1306.
[8] Lustig M, Donoho D, Pauly J M. Sparse MRI: the application of compressed sensing for Rapid MR Imaging. Magn Reson Med 2007; 58: 1182-1195.
[9] Sodickson D K, Manning W J. Simultaneous acquisition of spatial harmonics (SMASH): fast imaging with radiofrequency coil arrays. Magn Reson Med 1997; 38:591-603.
[10] Pruessmann K P, Weiger M, Scheidegger M B, Boesiger P. SENSE: sensitivity encoding for fast MRI. Magn Reson Med 1999; 42:952-962.
[11] Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47:1202-1210.
[12] Wiesinger F, Boesiger P, Pruessmann K P. Electrodynamics and ultimate SNR in parallel MR imaging. Magn Reson Med 2004; 52:376-390.
[13] Hardy C J, Giaquinto R A, Piel J E, Rohling K W, Marinelli L, Blezek D J, Fiveland E W, Darrow R D, Foo T K. 128-channel body MRI with a flexible high-density receiver-coil array. Magn Reson Med 2008; 28:1219-1225.
[14] Otazo R, Kim D, Axel L, Sodickson D. Combination of compressed sensing and parallel imaging for highly accelerated first-pass cardiac perfusion MRI. Magn Reson Med 2010; 64:767-776.
[15] Liang D, Liu B, Wang J, Ying L. Accelerating SENSE using compressed sensing. Magn Reson Med 2009; 62:1574-1584.
[16] Sieberlich N, Ehses P, Duerk J, Gilkeson R, Griswold M. Improved radial GRAPPA calibration for real-time free-breathing cardiac imaging. Magn Reson Med 2011; 65:492-505.
[17] Samsonov A A, Block W F, Arunachalam A, Field A S. Advances in locally constrained k-space-based parallel MRI. Magn Reson Med 2006; 55:431-438.
[18] Breuer F A, Blaimer M, Heidemann R M, Mueller M F, Griswold M A, Jakob, P M. Controlled aliasing in parallel imaging results in higher acceleration (CAIPIRINHA) for multi-slice imaging. Magn Reson Med 2005; 53:684-691.
[19] Arunachalam A. Method and System for Rapid MRI acquisition using tailored excitation modules. US 2014/0091798 A1.
[20] Arunachalam A. (2014) Enhancing the performance of accelerated MRI through preservation of acquisition SNR: An "aliased" k-space approach. Magn Reson Med. doi: 10.1002/mrm.25392
[21] Sacolick et al. "Multi-Frequency Parallel Transmit for Multi-Slice Scan Acceleration", Proceedings of the International Society for Magnetic Resonance in Medicine 17th Annual Meeting Proceedings 2009, 18 Apr. 2009 (2009 Apr. 18), page 4507, Honolulu, Hi., USA
[22] Stenger A et al. "Excitation UNFOLD (XUNFOLD) to improve the temporal resolution of multishot tailored RF pulses", Magnetic Reson Med 2006: 56, 692-697.
[23] Stoer J, Bulirsch R. Numerische mathematik 2, 3rd ed. Heidelberg: Springer; 1990. p 296.
[24] Figueiredo M A T, Dias, J B, Oliveira, J P, Nowak R D. On total variation denoising: a new majorization-minimization algorithm and an experimental comparison with wavelet denoising. In Proceedings of the IEEE International Conference on Image Processing, Atlanta, Ga., USA, 2006. p 2633-2636.

The invention claimed is:

1. A method of constructing an image of a sample from MRI data, the method comprising:
   i) selectively acquiring one or more sets of MRI data generated from driving signals created under a specific set of operation parameters, wherein the driving signals comprise
      a RF pulse, to which the specific set of operation parameters controls any one or more of its flip angle and phase; and
      a gradient pulse, to which the specific set of operation parameters controls its gradient amplitude, and
      wherein the specific set of operation parameters are tuned based on a random variation of one or more of the flip angle of the RF pulse, the phase of the RF pulse and the gradient amplitude of the gradient pulse by keeping one or more of the flip angle of the RF pulse, the phase of the RF pulse and the gradient amplitude of the gradient pulse constant from one measurement cycle to a subsequent measurement cycle, and varying the remainder of the flip angle of the RF pulse, the phase of the RF pulse and the gradient amplitude of the gradient pulse in the subsequent measurement cycle;
   ii) deriving a matrix representative of the driving signals used to acquire the one or more sets of MRI data, wherein the matrix changes in response to the tuning of the specific set of operation parameters;
   iii) processing the selectively acquired MRI data with the matrix to obtain output data; and
   iv) synthesizing the output data to construct the image of the sample.

2. The method of claim 1, wherein the random variation of the one or more of the flip angle of the RF pulse, the phase of the RF pulse and the gradient amplitude of the gradient pulse is based on a probability distribution function.

3. The method of claim 1, wherein each of the one or more sets of MRI data is generated under a different specific set of operation parameters, so that a different matrix is derived to process each of the one or more sets of MRI data, to obtain output data from which the image of the sample is constructed.

4. The method of claim 1, wherein step iii) comprises using an iterative process based on a either a linear data reconstruction technique or a non-linear data reconstruction technique.

5. The method of claim 4, wherein the linear data reconstruction technique comprises use of a regularization function.

6. The method of claim 1, wherein the one or more sets of MRI data of step i) and the output data of step iii) are k-space data.

7. The method of claim 1, wherein the selective acquiring of the one or more sets of MRI data comprises employing an overlapping technique; or both an overlapping and under-sampling technique.

8. The method of claim 7, wherein the under-sampling technique comprises acquiring only a portion of data in each of the one or more sets of MRI data resulting from the application of the overlapping technique to produce the selectively acquired MRI data of step iii).

9. The method of claim 8, wherein the overlapping technique comprises simultaneously acquiring one or more groups of data in each of the one or more sets of MRI data to produce the selectively acquired MRI data of step iii).

10. The method of claim 7, wherein the overlapping technique comprises simultaneously acquiring one or more groups of data in each of the one or more sets of MRI data to produce the selectively acquired MRI data of step iii).

11. The method of claim 1, further comprising the step of
   v) determining a sensitivity profile of each of one or more sensors that acquire the one or more sets of MRI data, wherein the derivation of the matrix factors in the sensitivity profile of each of the one or more sensors.

12. An MRI data processing server for constructing an image of a sample from MRI data, the data processing server comprising:
   at least one processor; and
   at least one memory including computer program code;
   the at least one memory and the computer program code configured to, with the at least one processor, cause the server at least to:
   i) selectively acquire one or more sets of MRI data generated from driving signals created under a specific set of operation parameters, wherein the driving signals comprise
      a RF pulse, to which the specific set of operation parameters controls any one or more of its flip angle and phase; and
      a gradient pulse, to which the specific set of operation parameters controls its gradient amplitude, and
      wherein the specific set of operation parameters are tuned based on a random variation of one or more of the flip angle of the RF pulse, the phase of the RF pulse and the gradient amplitude of the gradient pulse by keeping one or more of the flip angle of the RF pulse, the phase of the RF pulse and the gradient amplitude of the gradient pulse constant from one measurement cycle to a subsequent measurement cycle, and varying the remainder of the flip angle of the RF pulse, the phase of the RF pulse and the gradient amplitude of the gradient pulse in the subsequent measurement cycle;
   ii) derive a matrix representative of the driving signals used to acquire the one or more sets of MRI data, wherein the matrix changes in response to the tuning of the specific set of operation parameters;
   iii) process the selectively acquired MRI data with the matrix to obtain output data; and
   iv) synthesize the output data to construct the image of the sample.

13. A method of constructing an image of a sample from MRI data, the method comprising:
   i) selectively acquiring one or more sets of MRI data generated from driving signals created under a specific set of operation parameters, wherein the driving signals comprise
      an RF pulse, to which the specific set of operation parameters controls any one or more of its flip angle and phase; and
      a gradient pulse, to which the specific set of operation parameters controls its gradient amplitude, and
      wherein the specific set of operation parameters are tuned based on varying all of the flip angle of the RF pulse, the phase of the RF pulse and the gradient amplitude of the gradient pulse from one measurement cycle to a subsequent measurement cycle;
   ii) deriving a matrix representative of the driving signals used to acquire the one or more sets of MRI data, wherein the matrix changes in response to the tuning of the specific set of operation parameters;
   iii) processing the selectively acquired MRI data with the matrix to obtain output data; and iv) synthesising the output data to construct the image of the sample.

* * * * *